United States Patent [19]

Klank

[11] 4,201,943
[45] May 6, 1980

[54] TUNING CIRCUIT FOR A HIGH FREQUENCY HETERODYNE RECEIVER WITH TUNING CONTROLLED BY DIRECT VOLTAGE

[75] Inventor: Otto Klank, Arpke, Fed. Rep. of Germany

[73] Assignee: Licentia Patent-Verwaltungs-G.m.b.H., Frankfurt am Main, Fed. Rep. of Germany

[21] Appl. No.: 892,868

[22] Filed: Apr. 3, 1978

[30] Foreign Application Priority Data

Apr. 26, 1977 [DE] Fed. Rep. of Germany ....... 2718472

[51] Int. Cl.² .............................................. H04B 1/16
[52] U.S. Cl. ....................................... 455/185; 334/15
[58] Field of Search ................... 334/15; 325/453, 464, 325/465; 307/304

[56] References Cited

U.S. PATENT DOCUMENTS

| 3,117,293 | 1/1964 | Mortley | 325/453 |
| 4,075,567 | 2/1978 | Klank et al. | 325/464 |
| 4,077,009 | 2/1978 | Klank et al. | 325/453 |

FOREIGN PATENT DOCUMENTS

| 2229696 | 5/1973 | Fed. Rep. of Germany | 325/464 |
| 2507885 | 9/1975 | Fed. Rep. of Germany | 334/15 |

Primary Examiner—Alfred E. Smith
Assistant Examiner—Robert E. Wise
Attorney, Agent, or Firm—Spencer & Kaye

[57] ABSTRACT

In a tuning circuit the reception frequency is measured by counting the oscillations of the heterodyne oscillator, taking the intermediate frequency into account. The result of measurement is compared with a selected value. The tuning operation is controlled in accordance with the result of comparison and further in accordance with the tuning voltage in a manner to reduce non-linearities in the rate of tuning controlled by the tuning voltage.

9 Claims, 4 Drawing Figures

4,201,943

TUNING CIRCUIT FOR A HIGH FREQUENCY HETERODYNE RECEIVER WITH TUNING CONTROLLED BY DIRECT VOLTAGE

BACKGROUND OF THE INVENTION

Tuning circuits having digital selection are known as disclosed, for example, in the periodical Funkschau, published by Franzis Verlag GmbH, Munich, Germany, volume 2, pages 62 et seq. and volume 3, pages 93 et seq. (1974), in which the reception frequency is measured by counting the oscillations of the heterodyne oscillator, taking the intermediate frequency into account. The result of measurement is compared, in a comparator, with a value selected in a selector store. The tuning operation is controlled by an evaluation circuit in accordance with the comparison result. In the known circuit, means are provided by which the rate of tuning, or rate of change of the reception frequency, is reduced with increasing approach to the exact tuning point. This is effected by controlling an integrating member in accordance with the number of agreeing digits of the values located in the comparator and the position of these digits. This has the effect that the individual decades of the frequency value are run through in approximately the same time, whereby rapid tuning to the required transmitter is ensured. The steepness of the tuning frequency vs. tuning voltage characteristic, differing for the individual tuning points, of a capacitive diode of the heterodyne oscillator serving as tuning element cannot be taken into account, since the speed is controlled independently of the absolute frequency of the heterodyne oscillator and only in accordance with the difference from the selected value. The steepness of a capacitive diode may for example vary by a factor of 10 between at the ends of the control range utilized. This leads to waiting times of different lengths in the tuning, which acts adversely on the use of the apparatus.

SUMMARY OF THE INVENTION

It is an object of the invention to provide a tuning circuit in which the non-linearity of the steepness of tuning of the heterodyne oscillator is compensated to a great extent.

According to the invention, there is provided a tuning circuit for a high frequency heterodyne receiver with tuning controlled by direct voltage via a controllable reactance element, with an electronic counter for digital determination of the reception frequency by periodic counting of the oscillations of at least one heterodyne oscillator of the receiver, with a selection store, with a comparator for the comparison of the result of counting by the counter with the content of the selection store and with an evaluation circuit for evaluating the result of the comparison and with an integrating circuit for creating the tuning voltage, the integrating circuit being controlled by the evaluation circuit.

Further according to the invention, the integrating circuit is further regulated in accordance with the tuning voltage in a manner to reduce variations in the time rate of tuning frequency change the characteristic of the reactance element controlled by the tuning voltage and therewith of the tuning operation.

BRIEF DESCRIPTION OF THE DRAWINGS

In the following, the invention is explained with reference to a practical example illustrated in the drawing.

DESCRIPTION OF THE PREFERRED EMBODIMENTS

Figure 1:
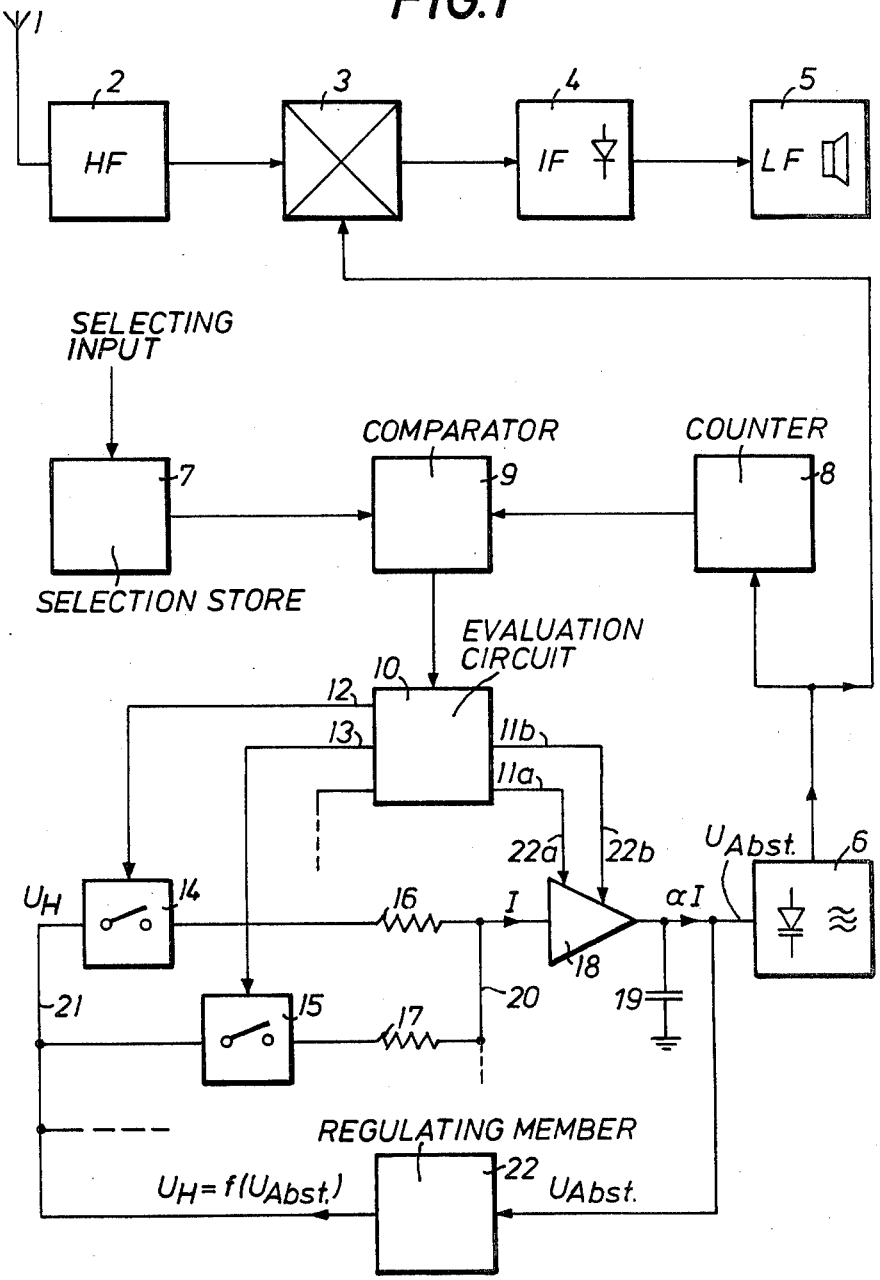
FIG. 1 shows a heterodyne receiver with a tuning circuit which has the features of the invention.

In the upper part of FIG. 1 is illustrated a heterodyne receiver with an antenna 1, an HF stage 2, a mixer stage 3, an IF amplifier and demodulator 4 and an LF amplifier and loud speaker 5. To the mixer stage 3 is fed the output signal of a heterodyne oscillator 6, which is a component of a tuning circuit illustrated in the lower part of FIG. 1. In known manner the tuning circuit includes a selection store, or memory 7, in which a desired value of reception frequency can be selected via a selector panel, not illustrated, or a stored value can be selected, and an electronic frequency counter 8 by which the reception frequency is measured by counting the oscillations of the heterodyne oscillator 6, taking into account the IF.

The content of the selection store 7 and the result of measurement of the frequency counter 8 are compared with one another in a comparator 9. In the known circuit, described in the above-cited periodical Funkschau 1974, volume 2, pages 62 et seq. the comparison of all digits takes place simultaneously. However, it is also known, as disclosed in German Offenlegungsschrift No. 25 33 072.7, to compare the digits associated with one another successively in so-called time multiplex operation. In the following, it will be assumed that the comparison takes place in multiplex operation as described in the above cited Offenlegungsschrift. To the output of the comparator is connected an evaluation circuit 10. The construction and operation of the evaluation circuit and its cooperation with other circuit parts 14, 15, 16, 17, 18 and 19 is described in detail in German Offenlegungsschrift No. 26 25 741.0. Here only the operation of the output signals of the evaluation circuit 10 will be described, so far as this is necessary for the understanding of the circuit. Signals at the outputs 12 and 13 of the evaluation circuit 10 control electronic switches 14 and 15, each of which may for example include a transistor. Signals at further outputs, not illustrated, may control further switches, likewise not illustrated. With each of these switches is associated a particular digit of the value selected in the selection store 7 or measured in the counter 8. So long as there is no agreement between the two digits compared in the comparator the corresponding switches are kept closed. From a common lead 21, on which there is an auxiliary voltage $U_H$, a current then flows via the switches 14 and 15 and respective resistors 16 and 17 to a common lead 20. The sum I of all the currents is fed to a current amplifier 18 having an amplifying factor $\alpha$. The direction of the amplifier current at the output of the current amplifier 18 is reversible by logical signals supplied to inputs 22a and 22b of the current amplifier 18, which are connected respectively to outputs 11a and 11b of the evaluation circuit 10, according to the direction of deviation of the values compared in the comparator 9. Such a reversible current amplifier 18 can be purchased as an integrated circuit CA 3080 (RCA). A capacitor 19 is charged or discharged by the current αI from amplifier 18. The charging voltage of the capacitor 19 represents the tuning voltage $U_{Abst}$ for the heterodyne oscillator 6, which is controllable via a capacitive diode. The circuit described consisting of the parts 14, 15, 16, 17, 18 and 19 is a controlled integrating circuit. The resistors 16 and 17 and any further resistors not illustrated may have such values that the value measured by the frequency counter 8 can be brought into agreement with the value in the selection store in as short a time as possible.

A regulating member 22 is provided to regulate the integrating circuit additionally to the control already described. The charging current of the capacitor 19 is influenced in accordance with the value of the tuning voltage $U_{Abst}$ in such manner that differences of tuning rate occasioned by the non-linearity of the characteristic of the tuning capacitive diode are compensated. The tuning voltage $U_{Abst}$ across capacitor 19 is applied to the input of the regulating member 22 and at the output of the regulating member 22 there appears an auxiliary voltage $U_H$ which is a function of the tuning voltage $U_{Abst}$. The auxiliary voltage $U_H$ is applied to the common lead 21. In this manner it determines the value of the charging current allowed through by the switches 14 and 15.

Figure 2:
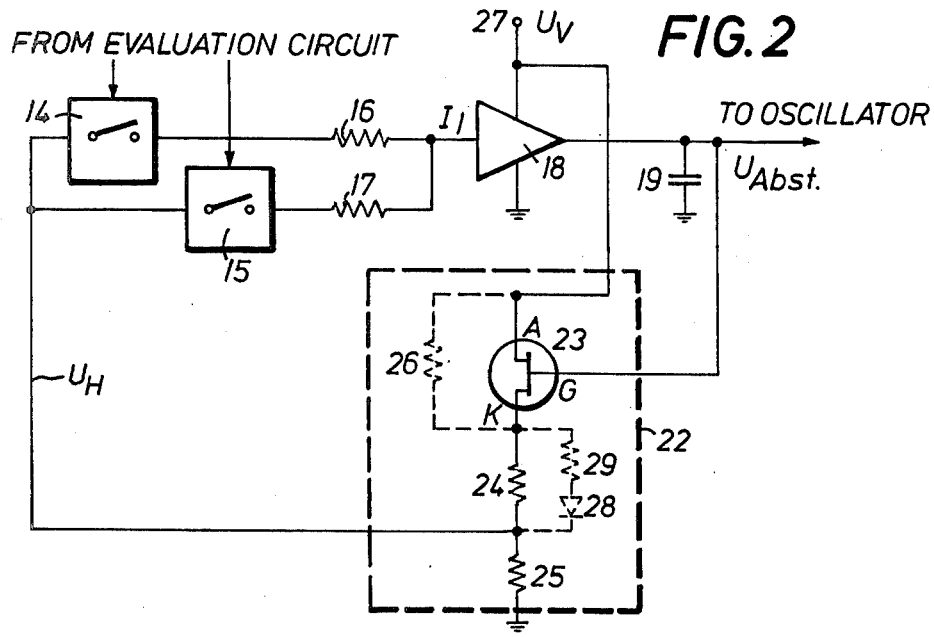
FIG. 2 shows a practical example of a regulating member provided in the circuit of FIG. 1.

In FIG. 2 is illustrated a practical example of the regulating member 22. A portion of the circuit of FIG. 1 is shown. The same reference numerals are used for the same parts. The regulating member 22 consists of an amplifying stage having a field effect transistor 23 and a resistance network consisting of the resistors 24, 25 and 26. Advantageously, owing to the use of a field effect transistor no noticeable charge is drawn from the capacitor 19. On the control electrode G (Gate) of the field effect transistor 23 there is the tuning voltage $U_{Abst}$, the anode A is at a positive supply voltage $U_V$ which is applied via a terminal 27, and the cathode K is connected to ground via the resistors 24 and 25 connected as a voltage divider.

From the anode A to the cathode K is connected a resistor 26. The value of this resistor 26 can determine a definite minimum value for the auxiliary voltage $U_H$, which is taken off at the junction of the resistors 24 and 25. The influence of the tuning voltage $U_{Abst}$ on the magnitude of the auxiliary voltage $U_H$ can be preselected by suitable selection of the division ratio of the voltage divider 24, 25, or adjusted if the voltage divider is constructed as a potentiometer. A series circuit formed by a resistor 29 and a diode 28, which is in parallel with the resistor 24, is shown in broken lines. By such a correcting member the dependence of the controlled capacitive diode can be compensated in known manner. Correspondingly the other resistor 25 may also be provided with such a correcting member. It is also possible to replace the resistor 24 or 25 by a resistor and a diode connected in series.

Figure 3:
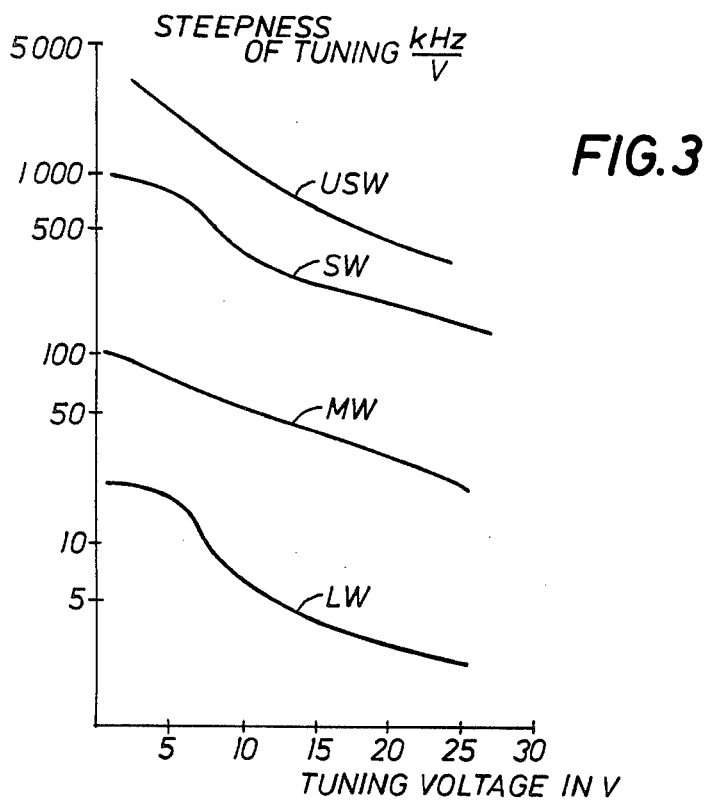
FIG. 3 shows examples of the characteristics of tuning capacity diodes in various tuning ranges.

In FIG. 3 is illustrated the steepness of tuning in kiloherz per volt (kHz/V) of capacitive diodes in the various broadcast tuning bands USW, SW, MW and LW as a function of the tuning voltage. It will be seen that the steepness of tuning at the start of each band differs by about a factor of 10 from the steepness of tuning at the end of the band. In the practical example of the invention described the linear rise of the auxiliary voltage $U_H$ with the tuning voltage $U_{Abst}$ has the effect that the speed with which the tuning voltage is altered is increased at high tuning voltages (to the right in FIG. 3), by a factor of 5 to 10 owing to higher values of the voltage $U_H$. Thereby the steepness of tuning, in itself slight, of the capacitive diode in this band is compensated.

If the tuning speeds in kiloherz per second (kHz/s) in the various tuning bands, in themselves differing greatly, are to be made similar to one another, then it is possible to make the regulating member 22 variable. There may e.g. be changes between various combinations of the resistance values of the resistors 24, 25 and 26.

Figure 4:
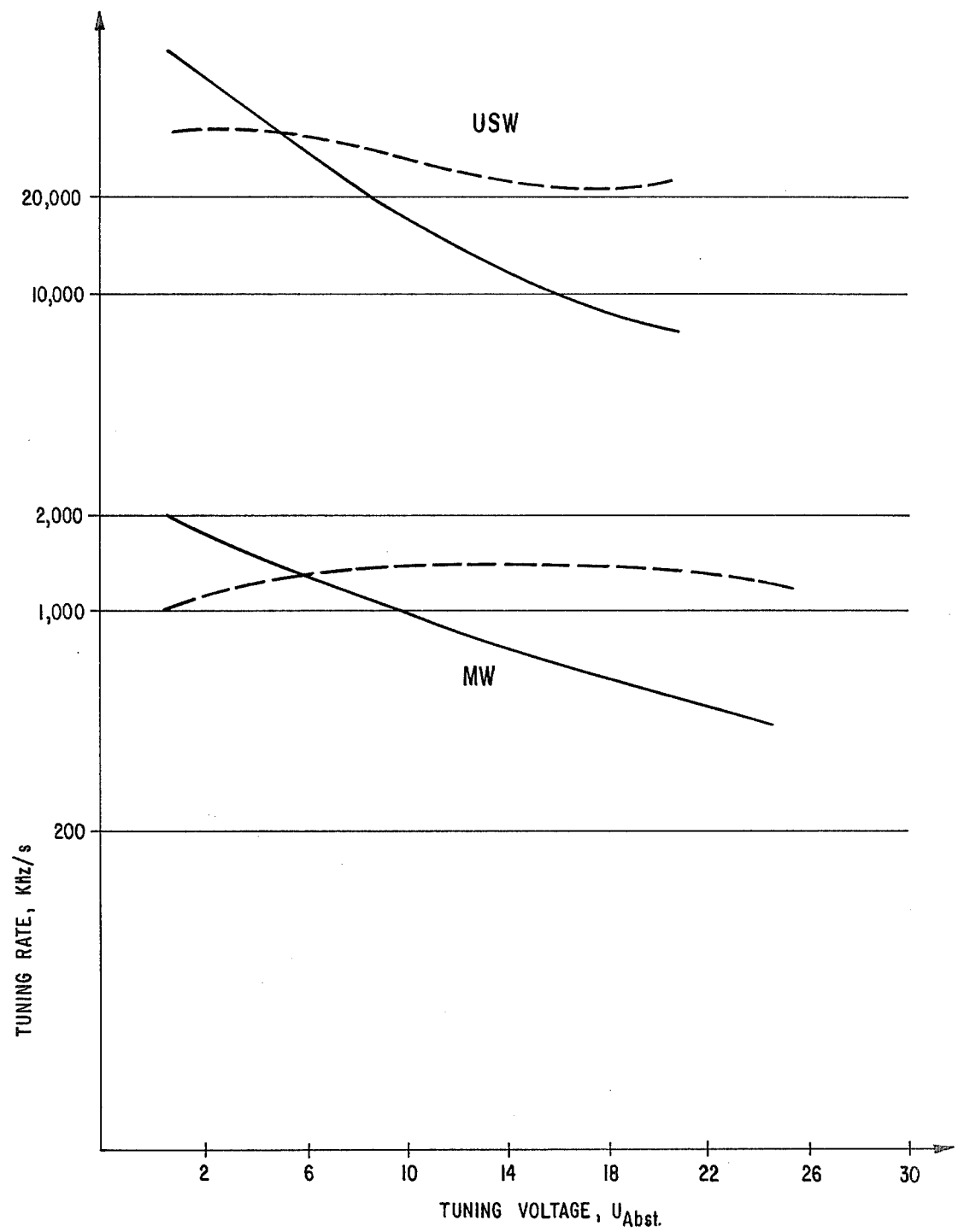
FIG. 4 illustrates the modified tuning behavior produced by the present invention.

FIG. 4 illustrates the manner in which the rate of tuning is improved according to the invention. The solid line curves illustrate the time rate of tuning, in KHz/second, as a function of tuning voltage, $U_{Abst}$, when the auxiliary voltage $U_H$ remains constant, for two exemplary tuning frequency ranges, USW and MW. The broken line curves illustrate the comparable tuning rates when, according to the invention, the auxiliary voltage $U_H$ increases with the tuning voltage. These curves show that such control of the auxiliary voltage acts to reduce variations in the time rate tuning frequency change.

What is claimed is:

1. In a circuit for a high frequency heterodyne receiver, including a controllable reactance element connected to receive a tuning voltage to effect tuning, an electronic counter for digital determination of the reception frequency by periodic counting of the oscillations of at least one heterodyne oscillator of the receiver, a selection memory, a comparator connected for comparing the result of counting by the counter with the content of the selection memory, an evaluation circuit connected for evaluating the result of the comparison, and an integrating circuit including a capacitor connected to be controlled by the evaluation circuit for producing the tuning voltage, the improvement wherein said circuit further comprises means connected to supply a charging current to said capacitor, said means including a source of an auxiliary voltage, a plurality of circuit units connected in parallel with one another between said voltage source and said integrating circuit, each said circuit unit being composed of a series arrangement of a resistor and an electronic switch connected to have its switching state controlled by a respective component of the comparison result produced by said comparator, whereby the charging current to said capacitor is a function of the value of the auxiliary voltage and the switching states of said electronic switches, and regulating means connected for causing the value of said auxiliary voltage to be a function of the value of said tuning voltage.

2. Tuning circuit according to claim 1 wherein said electronic switches are controlled by respective comparison digits of said comparator so that they are closed upon inequality of the digits concerned and opened upon equality.

3. Tuning circuit according to claim 1 wherein said reactance element is a capacitive diode having a substantially logarithmic variation of frequency with tuning voltage, such that the function of the steepness of tuning is substantially exponential.

4. Tuning circuit according to claim 1 wherein said regulating means provides, at its output, said auxiliary voltage, and has an essentially linear transfer function, the input of said regulating means is connected to receive said tuning voltage, and said regulating means comprises a resistance network for establishing a minimum value of said auxiliary voltage and for controlling the influence of said tuning voltage on said auxiliary voltage.

5. Circuit according to claim 4 wherein said regulating means comprises an amplifying circuit provided with a field effect transistor.

6. Circuit according to claim 5 wherein the control electrode of said field effect transistor is connected to said capacitor and said regulating means further comprises a voltage divider composed of two resistors connected to the cathode lead of said transistor and from which said auxiliary voltage is taken.

7. Circuit according to claim 6 wherein at least one of the two members of said voltage divider is formed by a resistor and a diode connected in series.

8. Circuit according to claim 6 wherein said voltage divider comprises a resistor and a diode connected together in series with one another and in parallel with one of said two resistors of said voltage divider.

9. Circuit according to claim 5 for determining the minimum value of the auxiliary voltage ($U_H$) wherein said regulating means further comprises a resistor connected across the anode-cathode path of said field effect transistor for controlling the minimum value of said auxiliary voltage.

* * * * *